(12) United States Patent
Kanemura

(10) Patent No.: US 8,796,669 B2
(45) Date of Patent: Aug. 5, 2014

(54) SEMICONDUCTOR TUNNEL FET TRANSISTOR DEVICE

(71) Applicant: Kabushiki Kaisha Toshiba, Tokyo (JP)

(72) Inventor: Takahisa Kanemura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/760,755

(22) Filed: Feb. 6, 2013

(65) Prior Publication Data

US 2014/0061777 A1 Mar. 6, 2014

(30) Foreign Application Priority Data

Sep. 6, 2012 (JP) ................................. 2012-196664

(51) Int. Cl.
*H01L 27/08* (2006.01)
*H01L 29/78* (2006.01)

(52) U.S. Cl.
USPC ................................ 257/38; 257/37; 257/314

(58) Field of Classification Search
CPC .................... H01L 27/11553; H01L 27/11556
USPC .................................. 257/8, 37, 38, 314, 315
See application file for complete search history.

(56) References Cited

U.S. PATENT DOCUMENTS

| 5,460,989 | A | * | 10/1995 | Wake | 438/259 |
|---|---|---|---|---|---|
| 5,589,696 | A | | 12/1996 | Baba | |
| 5,739,567 | A | * | 4/1998 | Wong | 257/316 |
| 5,939,751 | A | | 8/1999 | Jang | |
| 6,358,799 | B2 | * | 3/2002 | Odanaka et al. | 438/267 |
| 6,642,572 | B2 | * | 11/2003 | Kusumi et al. | 257/315 |
| 6,693,010 | B1 | * | 2/2004 | Mirgorodski | 438/257 |
| 6,768,162 | B1 | * | 7/2004 | Chang et al. | 257/316 |
| 2003/0122180 | A1 | * | 7/2003 | Sugiyama et al. | 257/314 |
| 2008/0169497 | A1 | * | 7/2008 | Iino et al. | 257/315 |
| 2009/0309150 | A1 | * | 12/2009 | Power et al. | 257/316 |

FOREIGN PATENT DOCUMENTS

| JP | 05-110086 A | 4/1993 |
|---|---|---|
| JP | 05-190847 A | 7/1993 |
| JP | 08-037298 A | 2/1996 |
| JP | 10-065169 A | 3/1998 |

OTHER PUBLICATIONS

Bowonder et al., "Low-Voltage Green Transistor Using Ultra Shallow Junction and Hetero-Tunneling", IWJT, 2008.
Anne S. Verhulst et al., "Complementary Silicon-Based Heterostructure Tunnel-FETs With High Tunnel Rates", IEEE Electron Device Letters, 2008.

* cited by examiner

*Primary Examiner* — Kenneth Parker
*Assistant Examiner* — Paul Budd
(74) *Attorney, Agent, or Firm* — Knobbe, Martens, Olson & Bear LLP

(57) ABSTRACT

In one embodiment, a semiconductor device includes a substrate, and a source region of a first conductivity type disposed on a surface of the substrate. The device further includes a tunnel insulator disposed on the source region, and an impurity semiconductor layer of a second conductivity type disposed on the tunnel insulator, the second conductivity type being different from the first conductivity type. The device further includes a gate insulator disposed on the impurity semiconductor layer, and a gate electrode disposed on the gate insulator. The device further includes a drain region of the second conductivity type disposed on the substrate so as to be separated from the impurity semiconductor layer, or disposed on the substrate as a portion of the impurity semiconductor layer.

20 Claims, 19 Drawing Sheets

SEMICONDUCTOR TUNNEL FET TRANSISTOR DEVICE

CROSS REFERENCE TO RELATED APPLICATION

This application is based upon and claims the benefit of priority from the prior Japanese Patent Application No. 2012-196664, filed on Sep. 6, 2012, the entire contents of which are incorporated herein by reference.

FIELD

Embodiments described herein relate to a semiconductor device.

BACKGROUND

A tunnel FET (tFET) is a transistor that obtains an on-state current by a band-to-band tunneling current, and has an advantage of exhibiting a smaller swing than that of a conventional FET. However, since the on-state current of the tunnel FET is smaller than that of the conventional FET, many proposals have been made to increase the on-state current of the tunnel FET. For example, a structure of the tunnel FET is proposed to include a source region of a first conductivity type, a drain region of a second conductivity type, and an impurity semiconductor layer of the second conductivity type (called pocket region) between an upper surface of the source region and a lower surface of a gate insulator. In this case, as the change in impurity concentration at a p-n junction plane between the source region and the pocket region is abrupter, the on-state current of the tunnel FET is larger. However, when forming this tunnel FET, there is a problem that impurities in the source region and the pocket region are diffused in performing activation annealing performed after ion implantation into these regions. As a result, the abruptness of the change in impurity concentration is lost. This makes it impossible to obtain a sufficient on-state current of the tunnel FET.

DETAILED DESCRIPTION

Embodiments will now be explained with reference to the accompanying drawings.

In one embodiment, a semiconductor device includes a substrate, and a source region of a first conductivity type disposed on a surface of the substrate. The device further includes a tunnel insulator disposed on the source region, and an impurity semiconductor layer of a second conductivity type disposed on the tunnel insulator, the second conductivity type being different from the first conductivity type. The device further includes a gate insulator disposed on the impurity semiconductor layer, and a gate electrode disposed on the gate insulator. The device further includes a drain region of the second conductivity type disposed on the substrate so as to be separated from the impurity semiconductor layer, or disposed on the substrate as a portion of the impurity semiconductor layer.

In the following description, first and second conductivity types are a p-conductivity type and an n-conductivity type, respectively. However, the first and second conductivity types may be an n-conductivity type and a p-conductivity type, respectively.

(First Embodiment)

Figure 1:
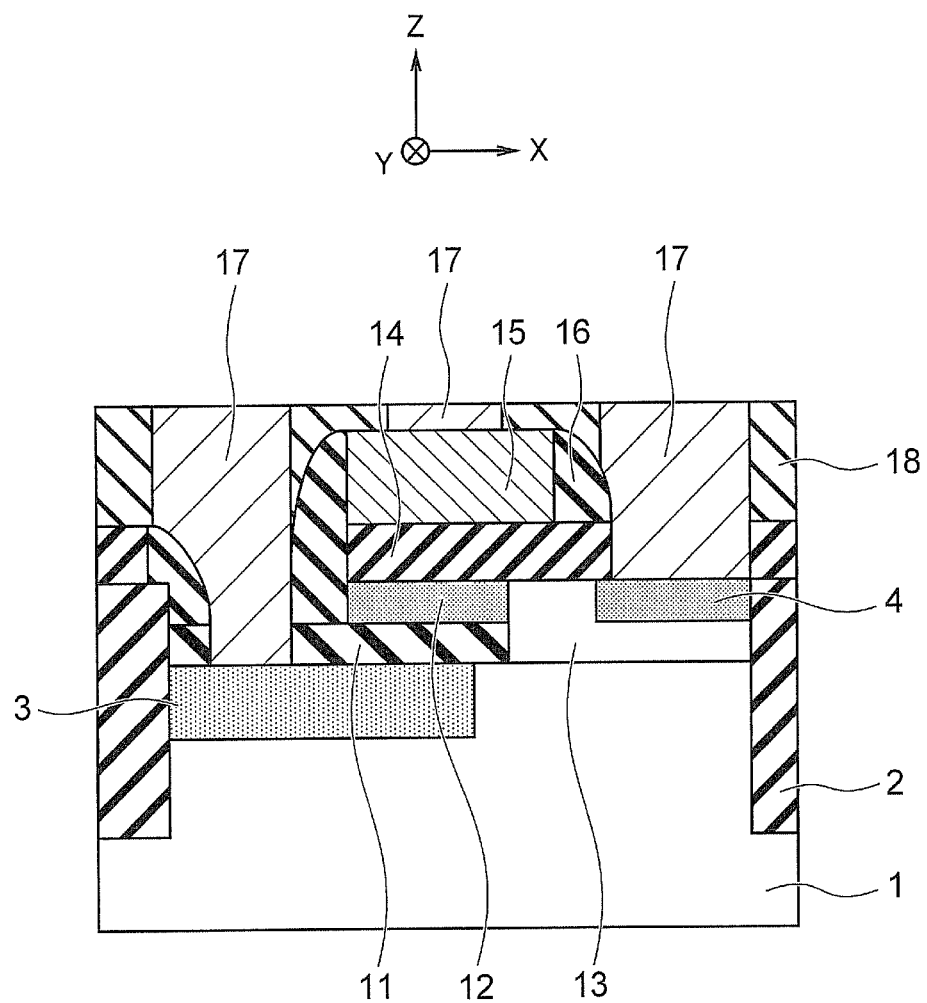
FIG. 1 is a cross-sectional view illustrating a structure of a semiconductor device of a first embodiment.

FIG. 1 is a cross-sectional view illustrating a structure of a semiconductor device of a first embodiment. FIG. 1 illustrates a cross section of a tunnel FET included in the semiconductor device. Although the tunnel FET in FIG. 1 is an nFET, the tunnel FET may be a pFET by interchanging the n-conductivity type and the p-conductivity type.

The semiconductor device in FIG. 1 includes a substrate 1, an isolation insulator 2, a source region 3, a drain region 4, a tunnel insulator 11, an impurity semiconductor layer 12, a semiconductor layer 13, a gate insulator 14, a gate electrode 15, sidewall insulators 16, contact plugs 17 and an inter layer dielectric 18.

The substrate 1 is, for example, a semiconductor substrate such as a silicon substrate. FIG. 1 indicates X and Y directions which are parallel to a surface of the substrate 1 and are perpendicular to each other, and a Z direction which is perpendicular to the surface of the substrate 1. The substrate 1 in the present embodiment is an n-type substrate.

The isolation insulator 2 is embedded in an isolation trench formed on the surface of the substrate 1. The isolation insulator 2 is, for example, a silicon oxide film. The isolation insulator 2 of the present embodiment is a shallow trench isolation (STI) insulator.

The source region 3 is formed on the surface of the substrate 1. The source region 3 of the present embodiment is a p+ type region.

The tunnel insulator 11 is formed on the source region 3. The tunnel insulator 11 is, for example, a silicon oxide film. In the present embodiment, a thickness of the tunnel insulator 11 is set so as not to disturb band-to-band tunneling between the source region 3 and the impurity semiconductor layer 12. For example, the thickness of the tunnel insulator 11 is set 2 nm or smaller. The tunnel insulator 11 in the present embodiment allows a tunnel current to flow through the tunnel insulator 11.

The impurity semiconductor layer 12 is formed on the tunnel insulator 11 and, more specifically, is formed on the source region 3 via the tunnel insulator 11. The impurity semiconductor layer 12 in the present embodiment is an n+ type layer whose conductivity type is opposite to that of the source region 3, and functions as a "pocket region of the tunnel FET." The band-to-band tunnel current flows between the source region 3 and this pocket region. The impurity semiconductor layer 12 is, for example, a silicon layer containing n-type impurities.

The semiconductor layer 13 is formed on the substrate 1 so as to be adjacent to the tunnel insulator 11 and the impurity semiconductor layer 12. More specifically, the semiconductor layer 13 is formed on the drain side of each of the tunnel insulator 11 and the impurity semiconductor layer 12. The semiconductor layer 13 in the present embodiment is an intrinsic-type (i-type) epitaxial semiconductor layer. The semiconductor layer 13 is, for example, a silicon layer.

The drain region 4 is formed in the semiconductor layer 13 so as to be separated from the impurity semiconductor layer 12. The drain region 4 in the present embodiment is an n+ type region whose conductivity type is opposite to that of the source region 3. In the present embodiment, a lower surface of the drain region 4 is higher than an upper surface of the source region 3.

The gate insulator 14 is formed on the impurity semiconductor layer 12 and the semiconductor layer 13. The gate insulator 14 is, for example, a silicon oxide film.

The gate electrode 15 is formed on the gate insulator 14 and, more specifically, is formed on the impurity semiconductor layer 12 and the semiconductor layer 13 via the gate insulator 14. The gate electrode 15 is, for example, a polysilicon layer. The gate electrode 15 in the present embodiment is an n+ type layer.

The sidewall insulators 16 are formed on side surfaces of the gate electrode 15 and the like. More specifically, the sidewall insulator 16 on the source side is continuously formed on side surfaces of the gate electrode 15 and the impurity semiconductor layer 12, and the sidewall insulator 16 on the drain side is formed on a side surface of the gate electrode 15. The sidewall insulators 16 are, for example, silicon nitride films.

The inter layer dielectric 18 is formed on the substrate 1 so as to cover the tunnel FET. The inter layer dielectric 18 is, for example, a silicon oxide film.

The contact plugs 17 are formed on the source region 3, the drain region 4 and the gate electrode 15 in the inter layer dielectric 18. A plug material of the contact plugs 17 is, for example, Al (aluminum).

(1) Impurity Concentration Distributions in Source Region 3 and Impurity Semiconductor Layer 12

Impurity concentration distributions in the source region 3 and the impurity semiconductor layer 12 will be described with reference to FIGS. 2A and 2B.

Figure 2A:
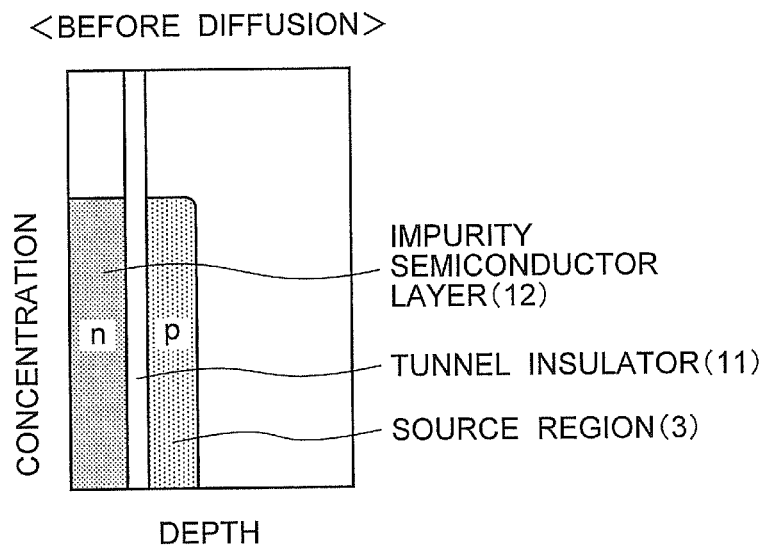
FIGS. 2A and 2B are graphs each illustrating impurity concentration distributions in a source region and an impurity semiconductor layer of the first embodiment.
Figure 2B:
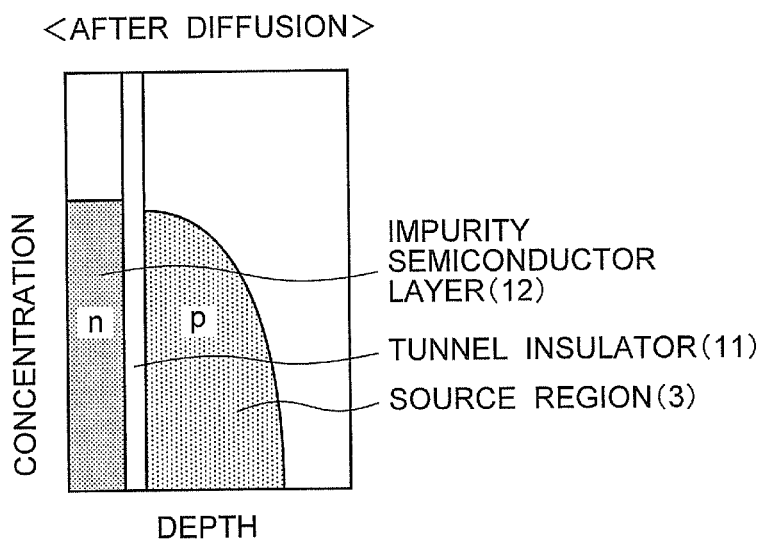

FIGS. 2A and 2B are graphs each illustrating impurity concentration distributions in the source region 3 and the impurity semiconductor layer 12 of the first embodiment.

FIG. 2A indicates impurity concentration distributions before impurities are diffused by activation annealing. The abscissa axis indicates depth and the ordinate axis indicates impurity concentration. As illustrated in FIG. 2A, the p-type impurity concentration is high in the source region 3, and is almost zero in the tunnel insulator 11 and the impurity semiconductor layer 12. Meanwhile, the n-type impurity concentration is high in the impurity semiconductor layer 12, and is almost zero in the tunnel insulator 11 and the source region 3. As described above, both the p-type impurity concentration and the n-type impurity concentration in the present embodiment abruptly change between the source region 3 and the impurity semiconductor layer 12.

FIG. 2B indicates impurity concentration distributions after the impurities are diffused by the activation annealing. Since the tunnel insulator 11 is formed between the source region 3 and the impurity semiconductor layer 12 in the present embodiment, diffusion of the impurities between the source region 3 and the impurity semiconductor layer 12 can be suppressed by the tunnel insulator 11.

Accordingly, as illustrated in FIG. 2B, almost no n-type impurities in the impurity semiconductor layer 12 diffuse to the source region 3. Furthermore, although some of the p-type impurities in the source region 3 diffuse to a region below the source region 3, almost no p-type impurities diffuse to the impurity semiconductor layer 12. In this manner, according to the present embodiment, diffusion of the impurities between the source region 3 and the impurity semiconductor layer 12 can be suppressed, whereby abruptness of change in impurity concentration between the source region 3 and the impurity semiconductor layer 12 can be maintained. As a result, the present embodiment can provide a large on-state current of the tunnel FET.

(2) Details of Source Region 3, Tunnel Insulator 11 and Impurity Semiconductor Layer 12

Details of the source region 3, the tunnel insulator 11 and the impurity semiconductor layer 12 will be described referring back to FIG. 1.

As described later, it is desirable that the impurity semiconductor layer 12 is formed by crystallizing an n+ type amorphous silicon layer. However, an n+ type polysilicon layer may be used as the impurity semiconductor layer 12 instead.

If the n+ type polysilicon layer is used as the impurity semiconductor layer 12, the impurity semiconductor layer 12 normally contains defects. However, if the concentration of n-type impurities in the impurity semiconductor layer 12 is high, almost no depletion layer is generated in the vicinity of a lower surface of the impurity semiconductor layer 12, and band-to-band tunneling is generated mostly between the vicinity of the lower surface of the impurity semiconductor layer 12 and the vicinity of the upper surface of the source region 3. Therefore, according to the present embodiment, in the case where the n+ type polysilicon layer is used as the impurity semiconductor layer 12, the concentration of n-type impurities in the impurity semiconductor layer 12 is made to be high, which can reduce the adverse effect by the defects in the impurity semiconductor layer 12 on a tunnel current.

As described later, use of a polysilicon layer as the impurity semiconductor layer 12 provides an advantage that the number of processes can be reduced compared to the case where the impurity semiconductor layer 12 is formed by using an amorphous silicon layer.

Furthermore, since the impurity semiconductor layer 12 in the present embodiment is interposed between the tunnel insulator 11 and the gate insulator 14, almost no n-type impurities in the impurity semiconductor layer 12 diffuse upward or downward. Therefore, according to the present embodiment, it is relatively easy to make the concentration of n-type impurities in the impurity semiconductor layer 12 be high. Therefore, according to the present embodiment, in the case where the n+ type polysilicon layer is used as the impurity semiconductor layer 12, the impurity semiconductor layer 12 can easily be formed so as to have a high n-type impurity concentration and provide a small adverse effect of defects on a tunnel current.

Furthermore, the impurity semiconductor layer 12 may be a semiconductor layer other than a silicon layer. Where the tunnel FET is an nFET, use of a semiconductor layer having a conduction band lower than a conduction band of silicon (for example, an $In_xGa_{1-x}As$ layer where $0<x<1$) enables a tunnel current to flow more easily. Furthermore, where the tunnel FET is a pFET, use of a semiconductor layer having a valence band higher than a valence band of layer (for example, a germanium layer) enables a tunnel current to flow more easily.

Likewise, although the source region 3 is formed in the silicon layer (silicon substrate) in the present embodiment, the source region 3 may be formed in a semiconductor layer other than a silicon layer.

Furthermore, the tunnel insulator 11 may be an insulator containing nitrogen. Examples of the tunnel insulator 11 include an ONO stack film that sequentially includes a first silicon oxide film ($SiO_2$ film), a silicon nitride film ($Si_3N_4$ film) and a second silicon oxide film ($SiO_2$ film). As a result that the tunnel insulator 11 contains nitrogen, the impurity diffusion suppression effect by the tunnel insulator 11 can be enhanced, for example.

Furthermore, the tunnel insulator 11 may be an insulator other than a silicon oxide film or an ONO stack film. Examples of the tunnel insulator 11 other than the silicon oxide film or the ONO stack film includes an insulator having a bandgap wider than a bandgap of the source region 3 and a bandgap of the impurity semiconductor layer 12 and capable of suppressing diffusion of impurities between the source region 3 and the impurity semiconductor layer 12.

(3) Effects of First Embodiment

Effects of the first embodiment will be described.

As described above, the tunnel insulator 11 in the present embodiment is formed between the source region 3 of the first conductivity type and the impurity semiconductor layer 12 of the second conductivity type. Therefore, according to the present embodiment, impurity diffusion between the source region 3 and the impurity semiconductor layer 12 can be suppressed to maintain the abruptness of the change in impurity concentration, which can provide a large on-state current of the tunnel FET.

Furthermore, the impurity semiconductor layer 12 in the present embodiment is formed on the tunnel insulator 11, which makes it possible to select manufacturing conditions to improve the film quality of the impurity semiconductor layer 12, and possible to increase the degree of freedom of the manufacturing conditions.

(Second Embodiment)

Figure 3:
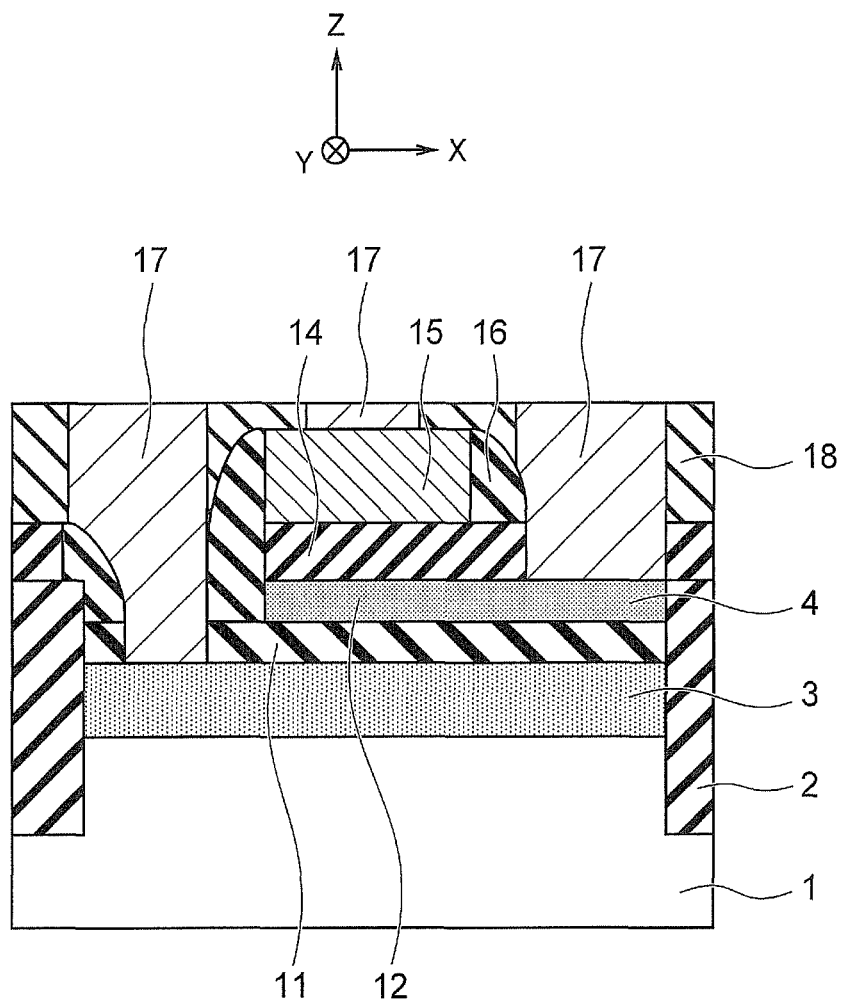
FIG. 3 is a cross-sectional view illustrating a structure of a semiconductor device of a second embodiment.

FIG. 3 is a cross-sectional view illustrating a structure of a semiconductor device of a second embodiment.

While the drain region 4 in the first embodiment is formed on the substrate 1 so as to be separated from the impurity semiconductor layer 12, the drain region 4 in the second embodiment is formed on the substrate 1 as a portion of the impurity semiconductor layer 12. Accordingly, in the second embodiment, while a region of the impurity semiconductor layer 12 sandwiched between the source region 3 and the gate electrode 15 functions as the pocket region, the other region of the impurity semiconductor layer 12 functions as the drain region 4.

Furthermore, the tunnel insulator 11 in the present embodiment is interposed between the source region 3 and the drain region 4. More specifically, the source region 3 and the tunnel insulator 11 in the present embodiment extend to a region under the drain region 4, so that the drain region 4 is formed above the source region 3 via the tunnel insulator 11.

In this manner, since the tunnel insulator 11 in the present embodiment is interposed between the source region 3 and the drain region 4, it can be difficult to make a forward current flow between the source region 3 and the drain region 4 without passing through the pocket region in the present embodiment. In other words, according to the present embodiment, a leakage current between the source region 3 and the drain region 4 can be reduced.

Therefore, according to the present embodiment, it is possible to reduce a distance between the source region 3 and the drain region 4 while a leakage current is reduced. As a result, according to the present embodiment, the area of a boundary portion in which the source region 3 and the pocket region face each other where a tunnel current is generated can be made to be large.

Furthermore, according to the present embodiment, it is possible to reduce variation of the area of the above boundary portion due to patterning in ion implantation into the impurity semiconductor layer 12, compared to the first embodiment.

Furthermore, according to the present embodiment, a need to separately form the impurity semiconductor layer 12 and the drain region 4 and a need to form the semiconductor layer 13 (see FIG. 1) on the substrate 1 are eliminated, so that the semiconductor device can be manufactured easily.

(1) Method of Manufacturing Semiconductor Device of Second Embodiment

A method of manufacturing the semiconductor device of the second embodiment will be described with reference to FIGS. 4A to 6C.

FIGS. 4A to 6C are cross-sectional views illustrating the method of manufacturing the semiconductor device of the second embodiment.

Figure 4A:
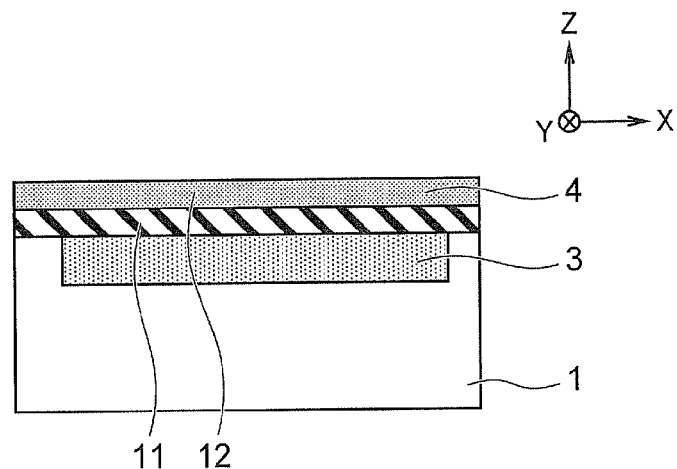
FIGS. 4A to 6C are cross-sectional views illustrating a method of manufacturing the semiconductor device of the second embodiment.

First, the substrate 1 is prepared, and ions are implanted into the surface of the substrate 1 to form the source region 3 (FIG. 4A). In this ion implantation, boron (B) is implanted, for example.

Next, the tunnel insulator 11 having a thickness of 2 nm or smaller is deposited on the entire surface of the substrate 1 (FIG. 4A). A non-illustrated opening is then formed in a part of the tunnel insulator 11 by lithography and etching using a resist film as a mask. The resist film is then removed.

Next, an amorphous silicon layer for forming the impurity semiconductor layer 12 is deposited on the entire surface of the substrate 1 (FIG. 4A). Low-energy ion implantation for implanting n-type impurities into the amorphous silicon layer is then performed. The n-type impurities implanted at this step are, for example, phosphorus (P) or arsenic (As). The substrate 1 is then annealed. As a result, the amorphous silicon layer is crystallized based on a crystal of the substrate 1.

Figure 4B:
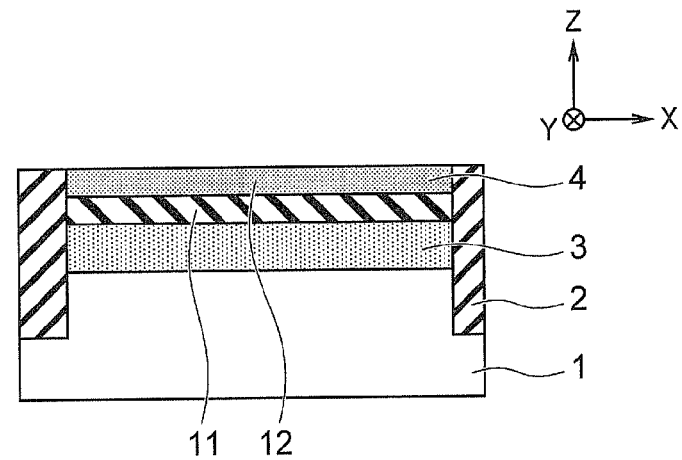

Next, as illustrated in FIG. 4B, the isolation insulator 2 is formed on the surface of the substrate 1. For example, the isolation insulator 2 is formed as follows. First, an isolation trench penetrating the impurity semiconductor layer 12 and the tunnel insulator 11 is formed on the surface of the substrate 1. A silicon oxide film is then deposited on the entire surface of the substrate 1 so that the silicon oxide film is embedded in the isolation trench. A surface of the silicon oxide film is then planarized by chemical mechanical polishing (CMP) to remove the silicon oxide film outside the isolation trench. Consequently, the isolation insulator 2 is formed.

Figure 4C:
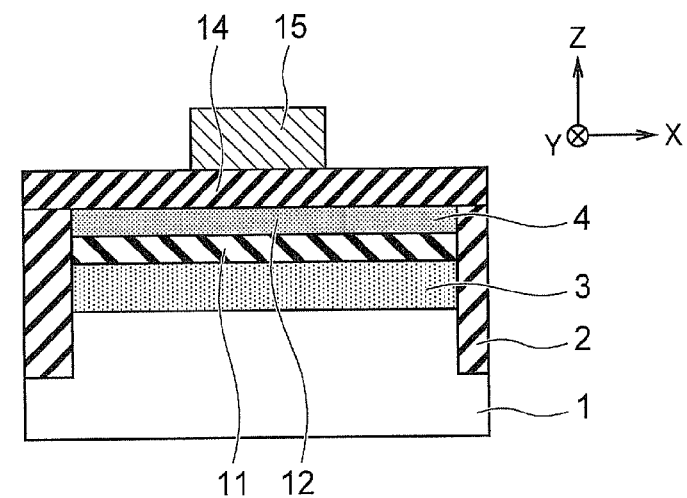

Next, as illustrated in FIG. 4C, the gate electrode 15 is formed on the impurity semiconductor layer 12 via the gate insulator 14. For example, the gate insulator 14 and the gate electrode 15 are formed as follows. First, an insulating material for forming the gate insulator 14 and an electrode material for forming the gate electrode 15 are sequentially deposited on the entire surface of the substrate 1. The electrode material is then etched using a resist film as a mask. Consequently, the gate insulator 14 and the gate electrode 15 are formed.

Figure 5A:
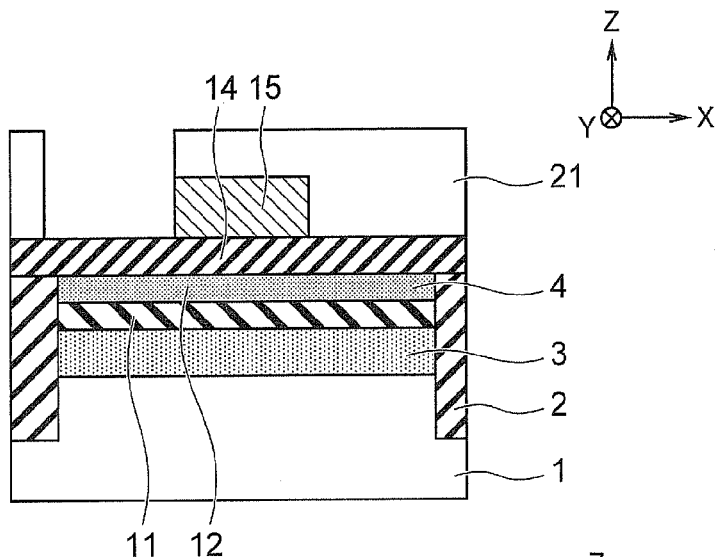

Next, a mask layer 21 is formed on the entire surface of the substrate 1 (FIG. 5A). An opening is then formed in the mask layer 21 by lithography and etching (FIG. 5A). The opening is formed in a region where a contact plug for the source region 3 is to be formed.

Figure 5B:
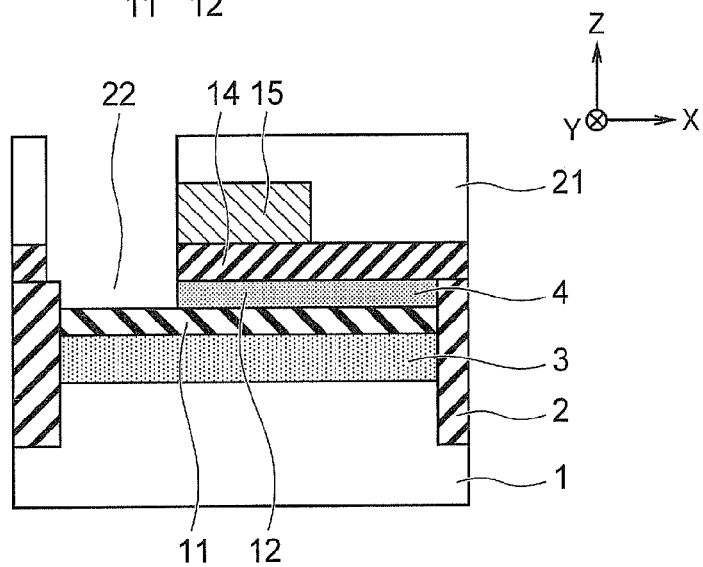

Next, as illustrated in FIG. 5B, the gate insulator 14 and the impurity semiconductor layer 12 under the opening are etched using the mask layer 21 as a mask. Reference numeral 22 denotes a trench formed by the etching. The mask layer 21 is then removed.

Figure 5C:
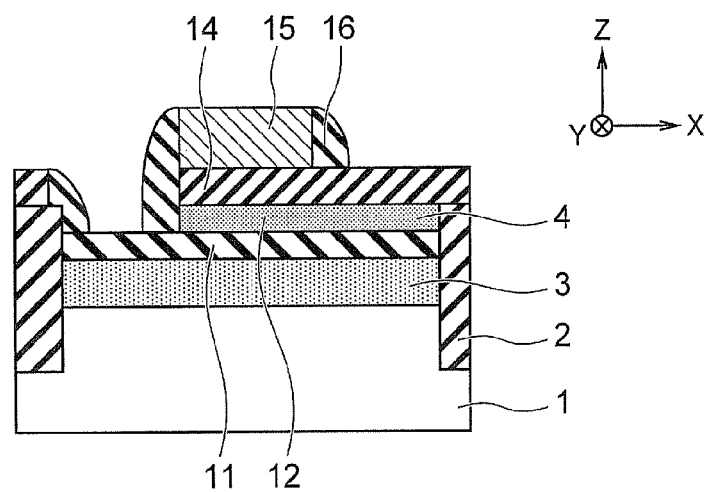

Next, as illustrated in FIG. 5C, the sidewall insulators 16 are formed on the side surfaces of the gate electrode 15 and the like. The sidewall insulators 16 are formed by, for example, depositing a silicon nitride film on the entire surface of the substrate 1 and etching the silicon nitride film.

Figure 6A:
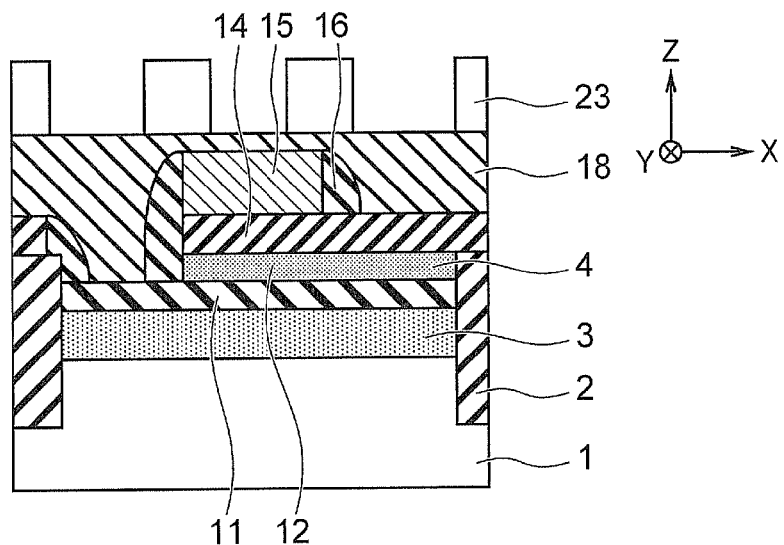

Next, the inter layer dielectric 18 and a mask layer 23 are sequentially deposited on the entire surface of the substrate 1 (FIG. 6A). Next, openings are formed in the mask layer 23 by lithography and etching (FIG. 6A). The openings are formed in regions where contact plugs for the source region 3, the drain region 4 and the gate electrode 15 are to be formed.

Figure 6B:
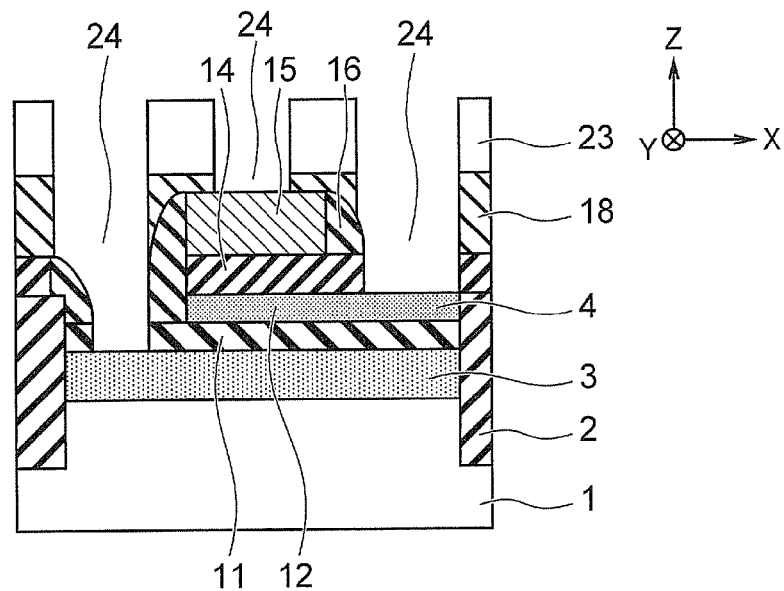

Next, as illustrated in FIG. 6B, the inter layer dielectric 18, the gate insulator 14 and the tunnel insulator 11 under the openings are etched using the mask layer 23 as a mask. Reference numeral 24 denotes contact holes formed by the etching. The mask layer 23 is then removed.

Figure 6C:
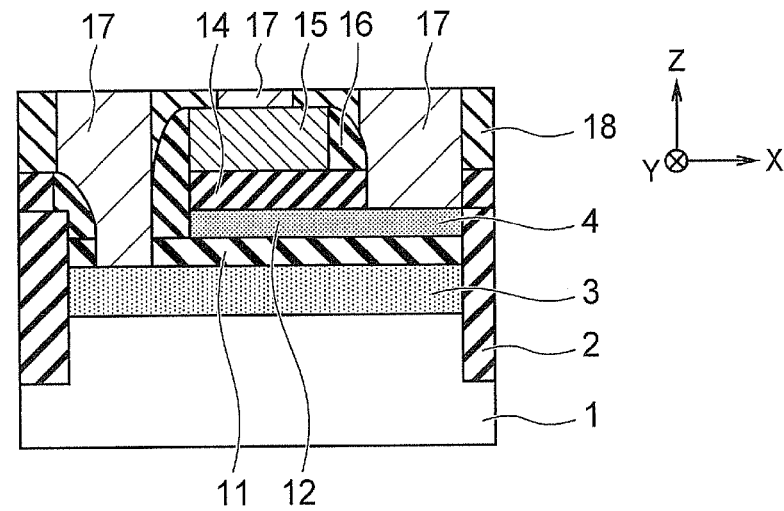

Next, as illustrated in FIG. 6C, contact plugs 17 are formed in the contact holes 24. The contact plugs 17 are formed by, for example, depositing a plug material on the entire surface of the substrate 1 and planarizing a surface of the plug material by CMP.

In the present embodiment, various inter layer dielectrics, via plugs, interconnect layers and the like are then formed on the substrate 1. Consequently, the semiconductor device in FIG. 3 is manufactured.

The impurity semiconductor layer 12 in the present embodiment may be a polysilicon layer, instead of forming the impurity semiconductor layer 12 by crystallizing an amorphous silicon layer. In this case, the impurity semiconductor layer 12 can be formed by depositing a polysilicon layer in the process of FIG. 4A, which eliminates the need to form the opening in a part of the tunnel insulator 11 in the process of FIG. 4A. As a result, the number of steps in the process of FIG. 4A can be reduced.

Furthermore, the method of manufacturing the semiconductor device of the present embodiment can be applied to the first embodiment. In this case, at the time between the process of FIG. 4A and the process of FIG. 4C, the trench penetrating the impurity semiconductor layer 12 and the tunnel insulator 11 is formed, the semiconductor layer 13 is formed in the trench, and the ion implantation for forming the drain region 4 in the semiconductor layer 13 is performed, for example. Furthermore, in the ion implantation for forming the source region 3, the implantation range is changed from a wide range for forming the source region 3 in FIG. 3 to a small range for forming the source region 3 in FIG. 1.

(2) Effects of Second Embodiment

Effects of the second embodiment will be described.

As described above, the tunnel insulator 11 in the present embodiment is interposed between the source region 3 and the drain region 4. Therefore, according to the present embodiment, the tunnel insulator 11 for suppressing impurity diffusion between the source region 3 and the impurity semiconductor layer 12 can reduce the leakage current between the source region 3 and the drain region 4.

(Third Embodiment)

Figure 7:
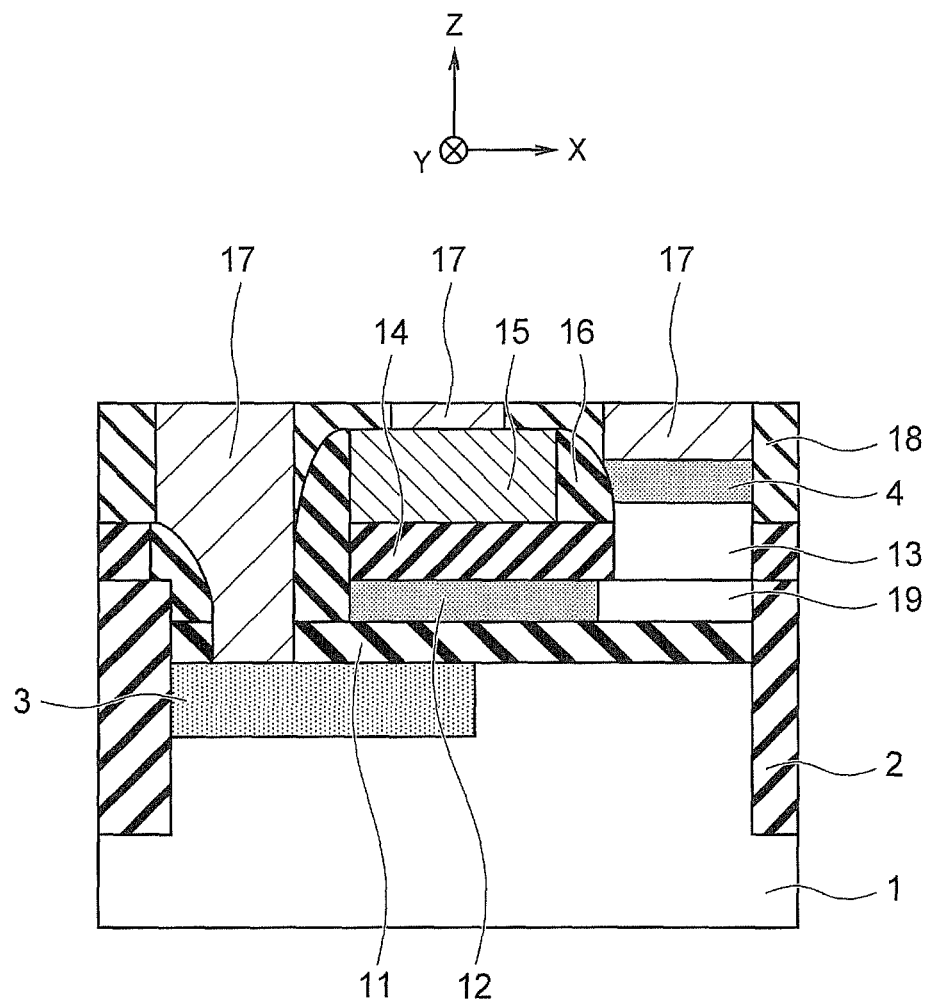
FIG. 7 is a cross-sectional view illustrating a structure of a semiconductor device of a third embodiment.

FIG. 7 is a cross-sectional view illustrating a structure of a semiconductor device of a third embodiment.

Similarly to the drain region 4 in the first embodiment, the drain region 4 in the present embodiment is separated from the impurity semiconductor layer 12. However, an n– type semiconductor region 19 is formed to be adjacent to the n+ type impurity semiconductor layer 12 in the present embodiment. Also, the intrinsic-type (i-type) semiconductor layer 13 is formed on the semiconductor region 19, and the drain region 4 is formed on the surface of the semiconductor layer 13. As a result, in the present embodiment, a height of a lower surface of the drain region 4 is higher than a height of an upper surface of the impurity semiconductor layer 12.

Furthermore, although the source region 3 and the impurity semiconductor layer 12 in the present embodiment extend in the entire region under the gate electrode 15, they do not extend to a region under the drain region 4. Accordingly, in the present embodiment, the area of a boundary portion in which the source region 3 and the impurity semiconductor layer 12 face each other is smaller than that of the second embodiment, but is larger than that of the first embodiment. Although the tunnel insulator 11 of the present embodiment extends to the region under the drain region 4, the tunnel insulator 11 may not extend to the region under the drain region 4, similarly to the source region 3 and the impurity semiconductor layer 12.

As described above, the drain region 4 in the present embodiment is arranged not at a position adjacent to the impurity semiconductor layer 12 but at a position higher than that position. Therefore, according to the present embodiment, a distance between the source region 3 and the drain region 4 is made to be long, which can reduce the leakage current between these regions 3 and 4.

The impurity semiconductor layer 12 and the semiconductor region 19 in the present embodiment can be formed by, for example, performing ion implantation for forming an n+ type layer and an n– type layer in an amorphous silicon layer in the process of FIG. 4A. As a result, the former becomes the n+ type impurity semiconductor layer 12 and the latter becomes the n– type semiconductor region 19.

Furthermore, the semiconductor layer 13 and the drain region 4 in the present embodiment can be formed, between the process of FIG. 6B and the process of FIG. 6C, by forming the semiconductor layer 13 on the semiconductor region 19 exposed in the contact hole 24 and forming the drain region 4 on the surface of the semiconductor layer 13, for example.

In the present embodiment, at least one of the source region 3 and the impurity semiconductor layer 12 may extend to the region under the drain region 4. In this case, the effect of reduction in leakage current between the source region 3 and the drain region 4 can be provided.

(Fourth Embodiment)

Figure 8A:
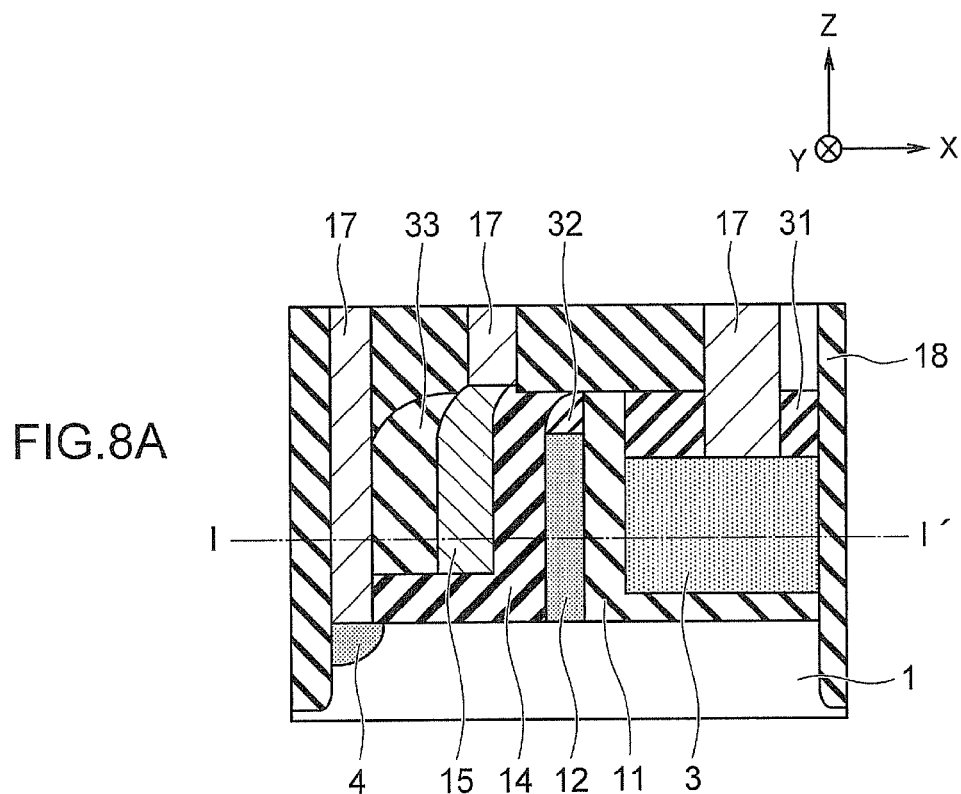
FIGS. 8A and 8B are cross-sectional views illustrating a structure of a semiconductor device of a fourth embodiment.
Figure 8B:
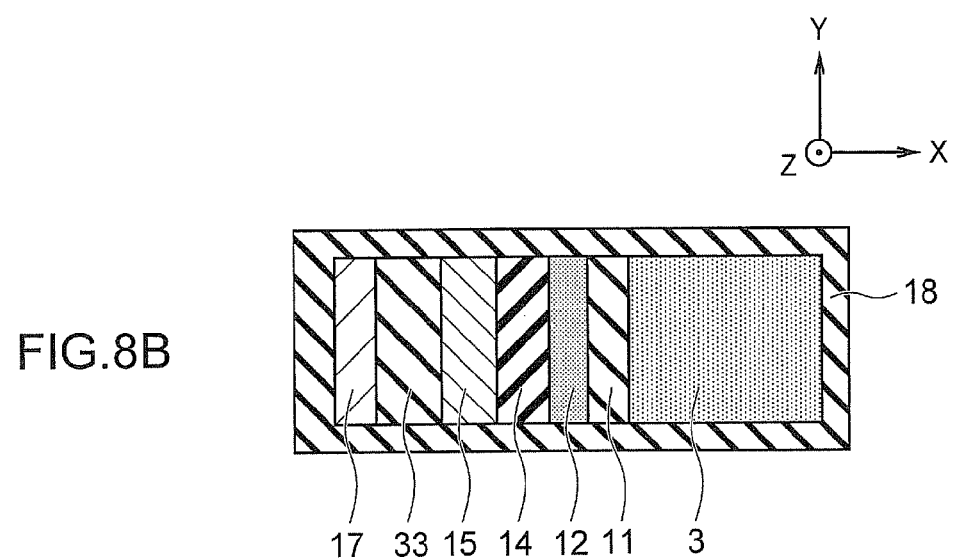

FIGS. 8A and 8B are cross-sectional views illustrating a structure of a semiconductor device of a fourth embodiment. FIG. 8B illustrates a cross section along line I-I' indicated in FIG. 8A.

The semiconductor device of the present embodiment includes a tunnel FET having a vertical structure. In the description of the present embodiment, the "source region 3" and the "drain region 4" are referred to as a "source layer 3" and a "drain layer 4", respectively.

As illustrated in FIGS. 8A and 8B, the source layer 3 in the present embodiment is formed on the substrate 1, and the tunnel insulator 11, the impurity semiconductor layer 12, the gate insulator 14 and the gate electrode 15 are sequentially formed on a side surface of the source layer 3. Furthermore, the tunnel insulator 11 and the gate insulator 14 have L-shapes in cross-section, the source layer 3 is formed on the substrate 1 via the tunnel insulator 11, and the gate electrode 15 is formed on the substrate 1 via the gate insulator 14.

Furthermore, the drain layer 4 is formed on the surface of the substrate 1 so as to be separated from the impurity semiconductor layer 12. In the present embodiment, since the source layer 3 is formed above the substrate 1 and the drain layer 4 is formed in the substrate 1, a height of an upper surface of the drain layer 4 is lower than a height of a lower surface of the source layer 3.

The semiconductor device of the present embodiment further includes an insulator 31 formed on the source layer 3, an insulator 32 formed on the impurity semiconductor layer 12, and an insulator 33 formed on a side surface of the gate electrode 15. The insulators 31 to 33 are, for example, silicon oxide films. Details of the insulators 31 to 33 will be described later.

As described above, the tunnel insulator 11, the impurity semiconductor layer 12, the gate insulator 14 and the gate electrode 15 in the first to third embodiments are sequentially formed on the upper surface of the source region 3. Meanwhile, the tunnel insulator 11, the impurity semiconductor layer 12, the gate insulator 14 and the gate electrode 15 in the present embodiment are sequentially formed on the side surface of the source layer 3.

Therefore, according to the present embodiment, the on-state current of the tunnel FET can be increased by increasing sizes of the source layer 3, the tunnel insulator 11, the impurity semiconductor layer 12, the gate insulator 14 and the gate electrode 15 in the vertical direction (Z-direction) without increasing the area occupied by the tunnel FET on the substrate 1.

In the present embodiment, when 0 V is applied to the source layer 3 and a positive voltage (for example, 1 V) is applied to the drain layer 4 and the gate electrode 15, a tunnel current flows from the source layer 3 to the impurity semiconductor layer 12 via the tunnel insulator 11, and the tunnel current flows to the drain layer 4 via the substrate 1.

FIG. 8B illustrates one tunnel FET surrounded by the inter layer dielectric 18. In this manner, tunnel FETs in the present embodiment are each surrounded by the inter layer dielectric 18 and arranged at regular intervals on the substrate 1.

(1) Method of Manufacturing Semiconductor Device of Fourth Embodiment

A method of manufacturing the semiconductor device of the fourth embodiment will be described with reference to FIGS. 9A to 19B.

FIGS. 9A to 19B are cross-sectional views illustrating the method of manufacturing the semiconductor device of the fourth embodiment.

Figure 9A:
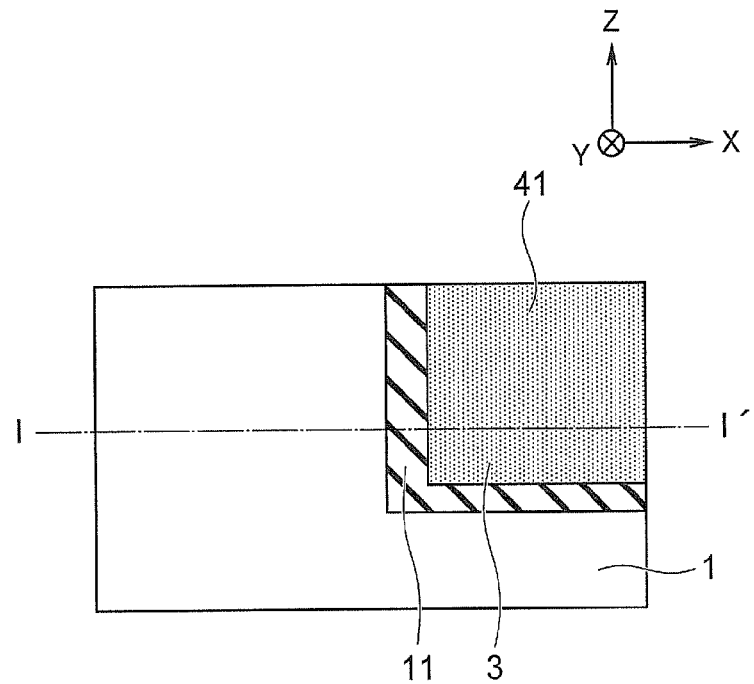
FIGS. 9A to 19B are cross-sectional views illustrating a method of manufacturing the semiconductor device of the fourth embodiment.
Figure 9B:
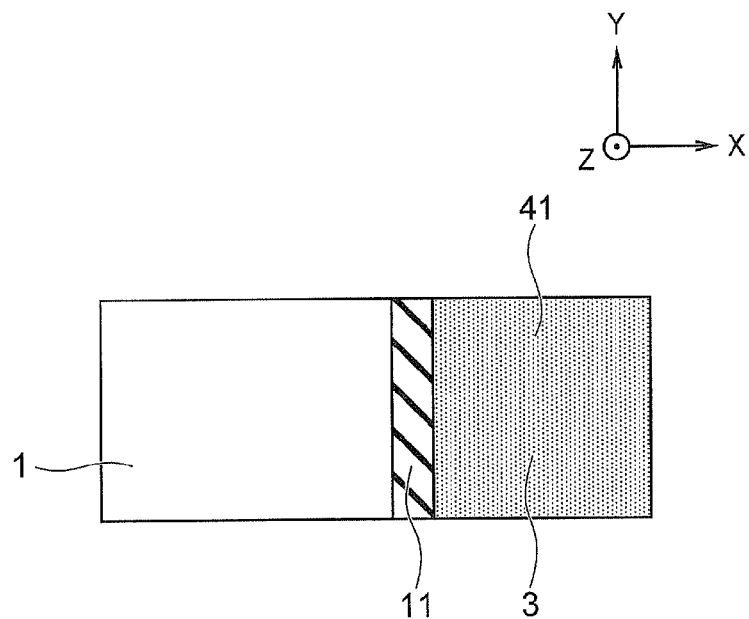

First, the substrate 1 is prepared, and a trench 41 is formed on the surface of the substrate 1 by etching using a non-illustrated mask layer (FIGS. 9A and 9B).

Next, the tunnel insulator 11 is deposited on the entire surface of the substrate 1. As a result, the tunnel insulator 11 is formed on a side surface and a bottom surface of the trench 41 (FIGS. 9A and 9B).

Next, a semiconductor layer (for example, a p+ type polysilicon layer) for forming the source layer 3 is deposited on the entire surface of the substrate 1, and the surface of the semiconductor layer is planarized by CMP. As a result, the source layer 3 is formed in the trench 41 via the tunnel insulator 11 (FIGS. 9A and 9B).

Figure 10A:
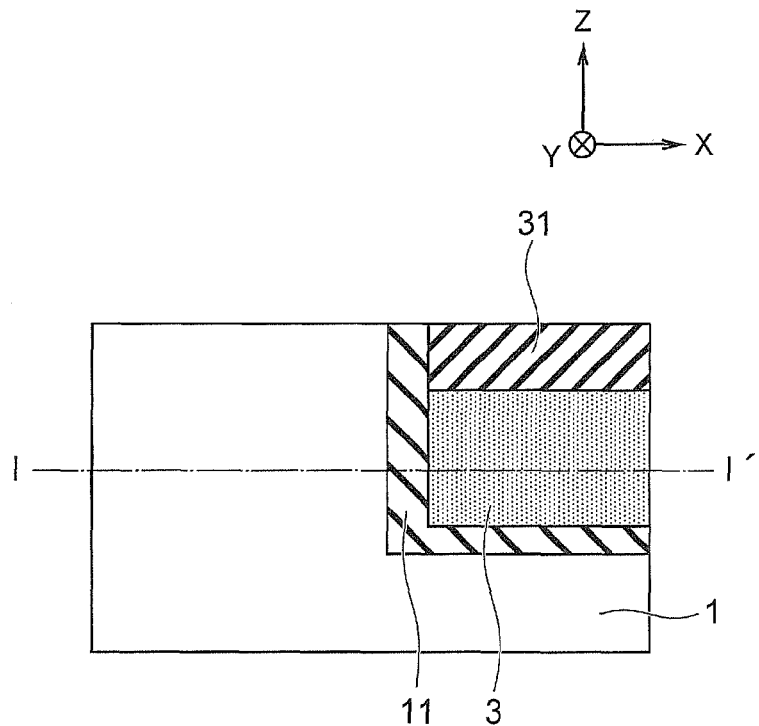
Figure 10B:
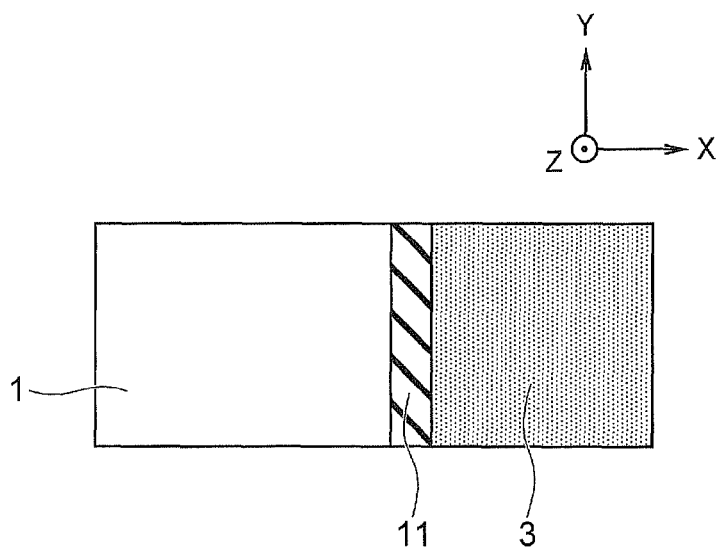

Next, as illustrated in FIGS. 10A and 10B, the insulator 31 is formed on a surface of the source layer 3. For example, the insulator 31 is formed as follows. First, the insulator 31 is formed on the surfaces of the substrate 1 and the source layer 3 by oxidation. Here, because of a difference in oxidation rate between the substrate 1 and the source layer 3, a portion of the insulator 31 on the source layer 3 becomes thicker than a portion of the insulator 31 on the substrate 1. The surface of the insulator 31 is then planarized by CMP so that only the portion of the insulator 31 on the source layer 3 remains. In this way, the insulator 31 illustrated in FIGS. 10A and 10B is formed.

Figure 11A:
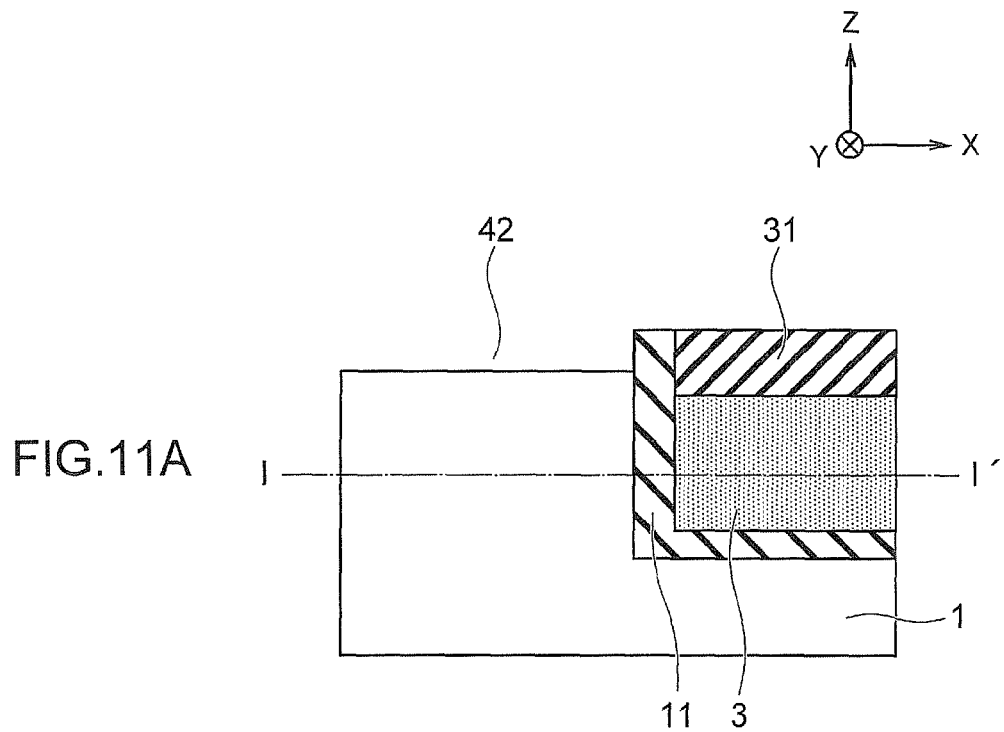
Figure 11B:
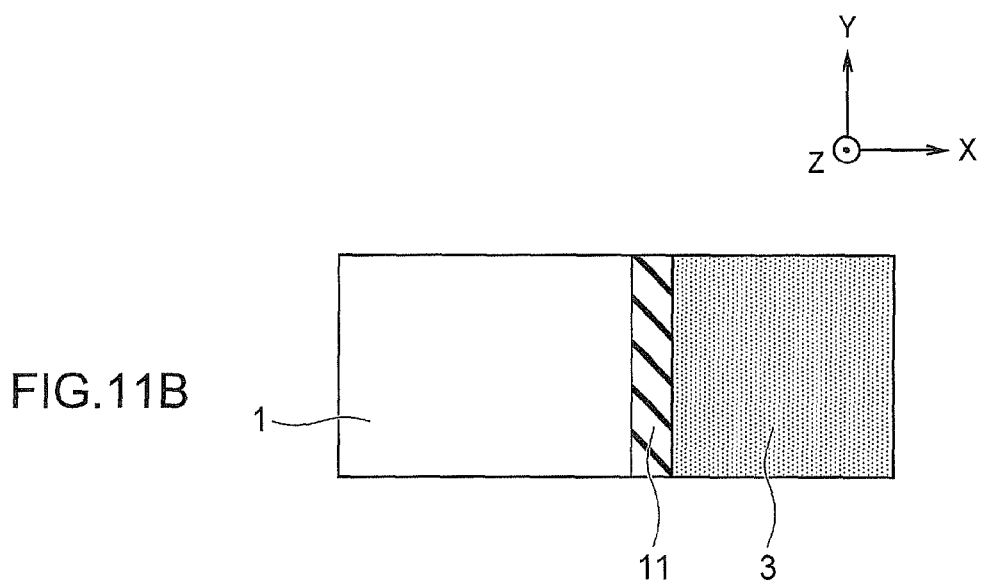
Figure 12A:
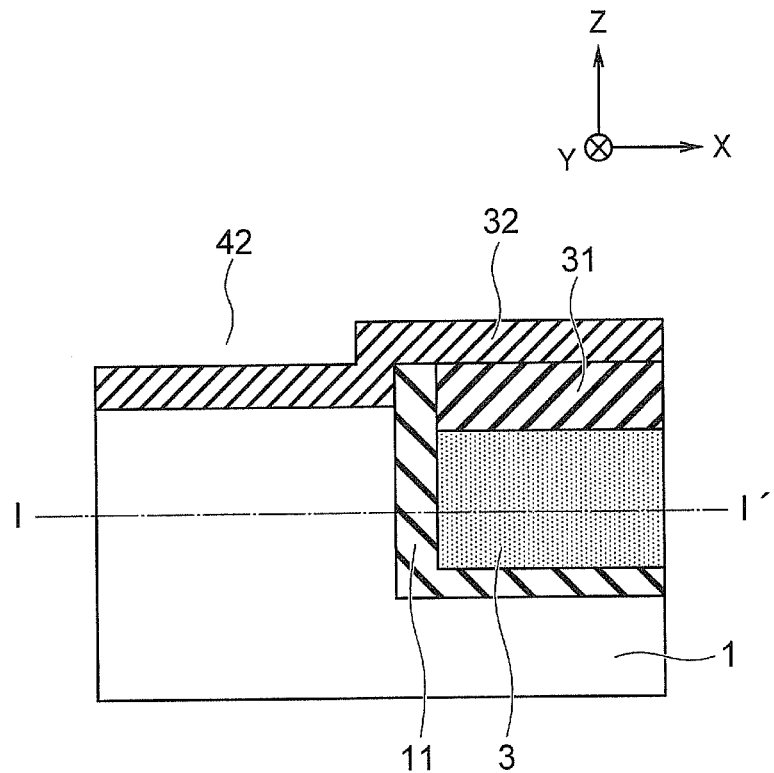
Figure 12B:
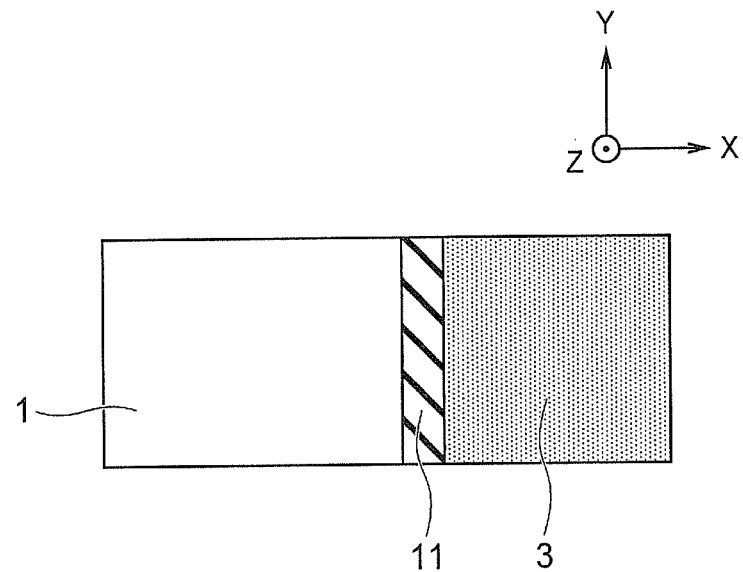
Figure 13A:
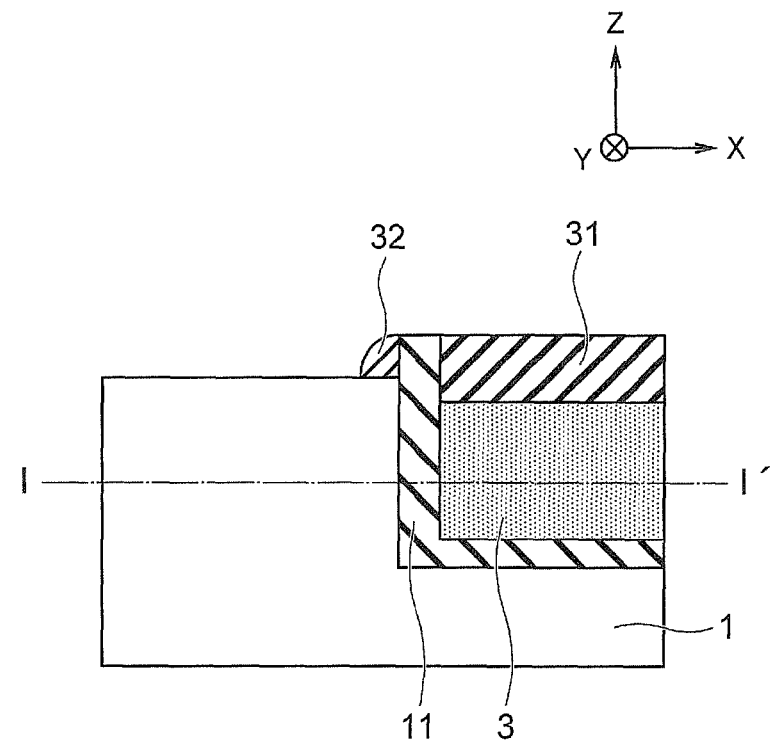
Figure 13B:
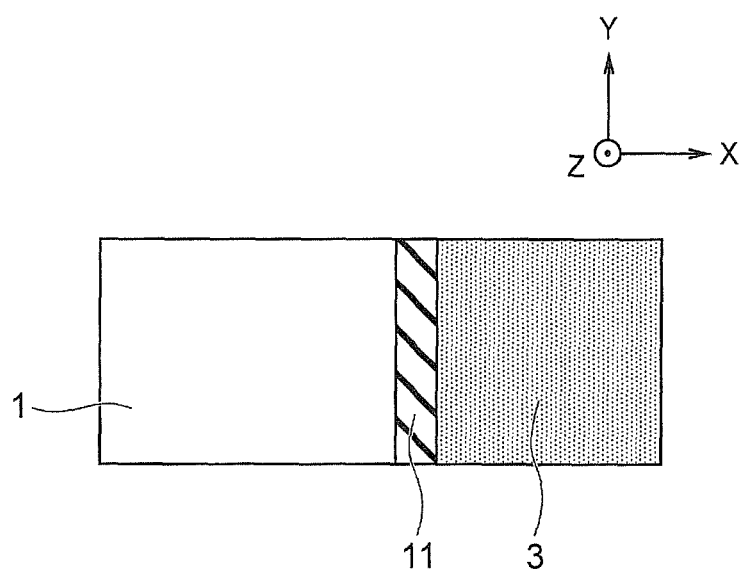
Figure 14A:
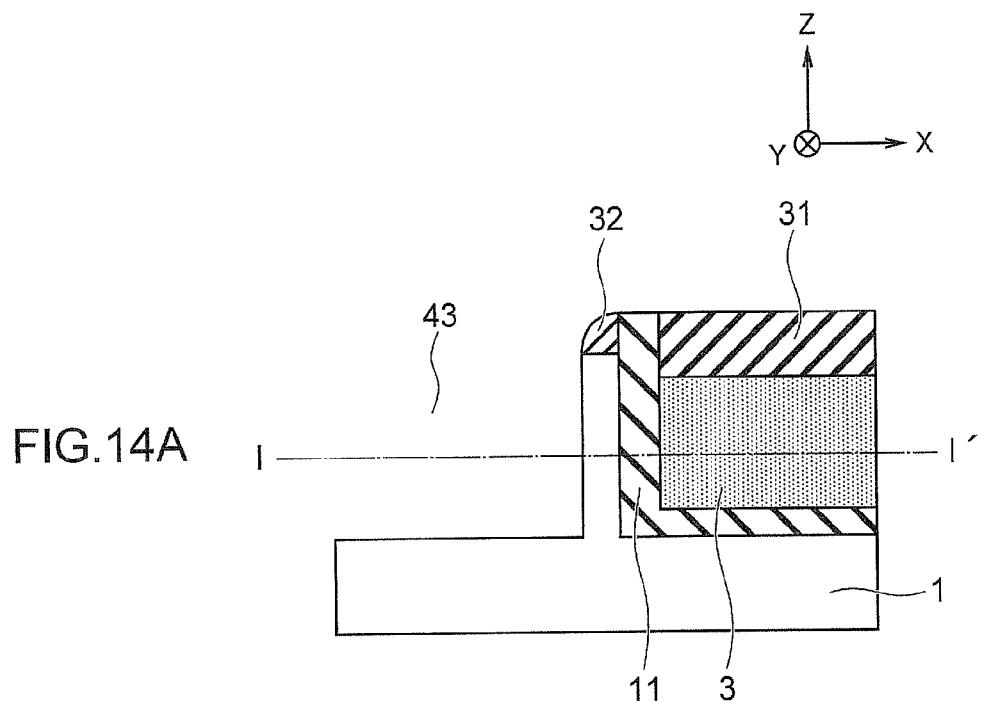
Figure 14B:
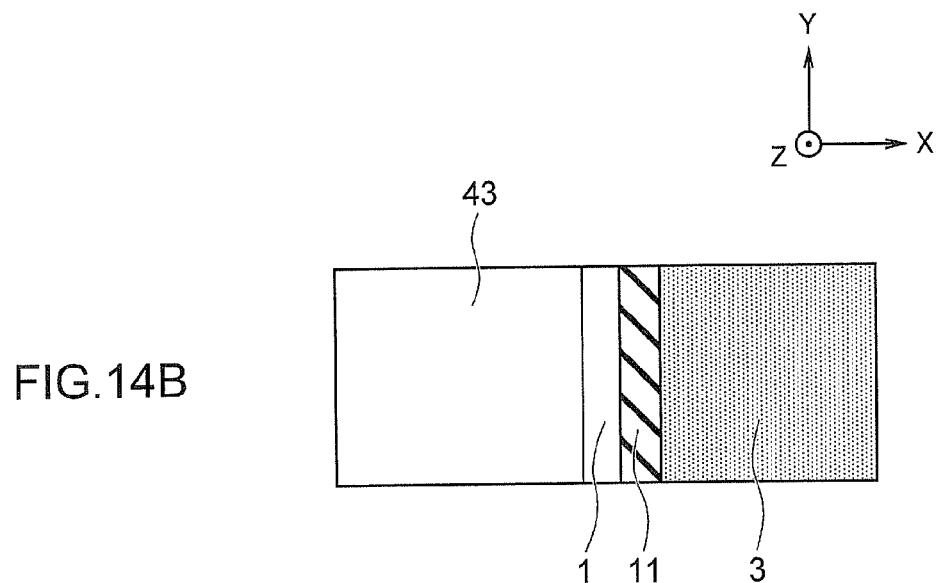

Next, as illustrated in FIGS. 11A and 11B, the surface of the substrate 1 is shallowly etched. As a result, a trench 42 is formed on the surface of the substrate 1. As illustrated in FIGS. 12A and 12B, the insulator 32 is then deposited on the entire surface of the substrate 1. As illustrated in FIGS. 13A and 13B, the insulator 32 is then etched so that the insulator 32 remains on the side surface of the tunnel insulator 11. As illustrated in FIGS. 14A and 14B, the surface of the substrate 1 is then etched using the tunnel insulator 11, the insulator 31 and the insulator 32 as a mask. As a result, a trench 43 is formed on the surface of the substrate 1. Furthermore, as illustrated in FIGS. 14A and 14B, a portion of the substrate 1 remains as a protruding portion that protrudes from the substrate 1, between the tunnel insulator 11 and the trench 43.

Figure 15A:
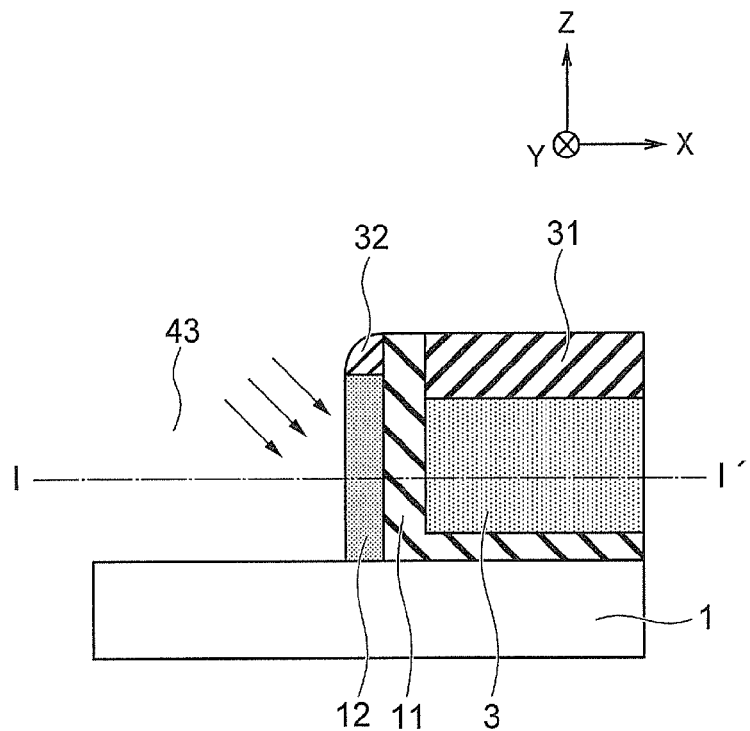
Figure 15B:
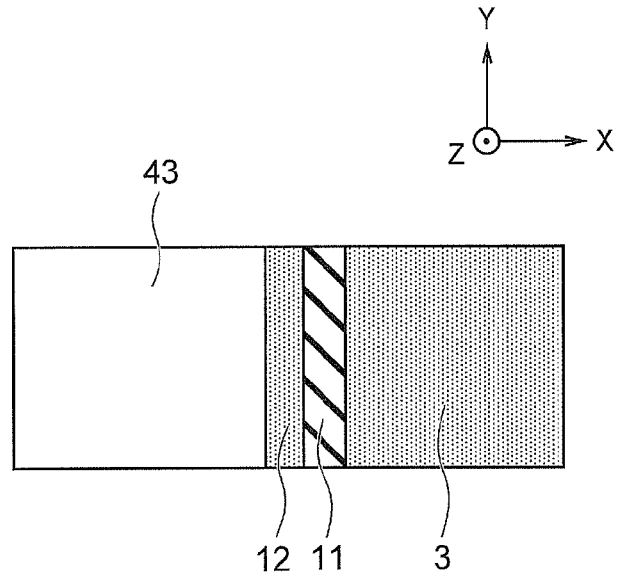

Next, as illustrated in FIGS. 15A and 15B, ions are implanted into the protruding portion of the substrate 1. In this ion implantation, phosphorus (P) or arsenic (As) is implanted, for example. The substrate 1 is then annealed, whereby the impurity semiconductor layer 12 is formed in the protruding portion of the substrate 1 (FIGS. 15A and 15B).

Figure 16A:
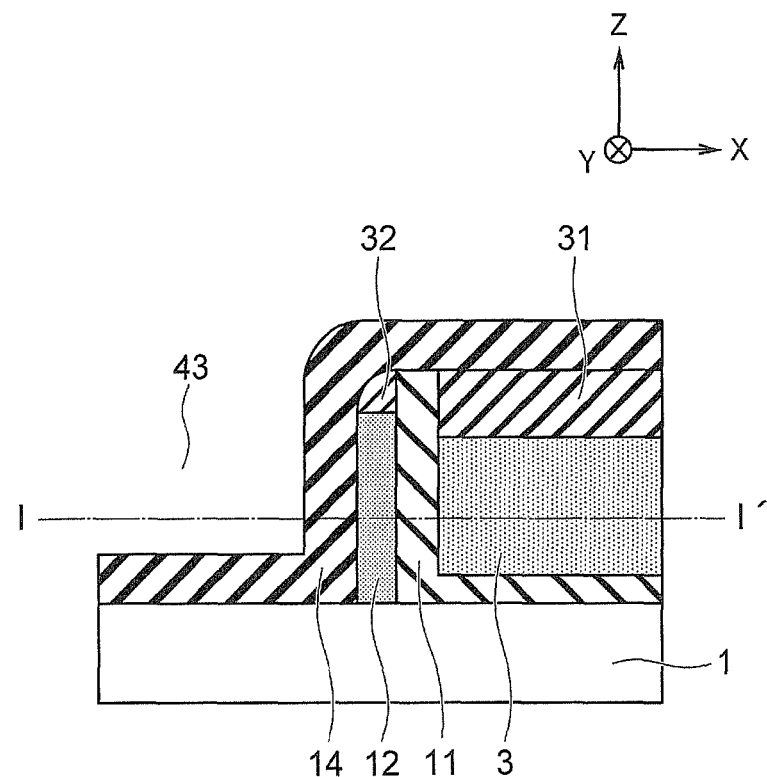
Figure 16B:
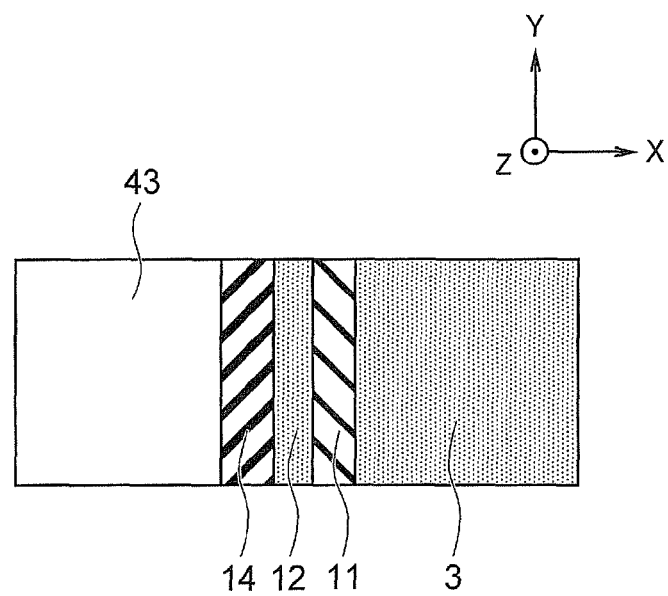

Next, as illustrated in FIGS. 16A and 16B, an insulating material for forming the gate insulator 14 is deposited on the entire surface of the substrate 1.

Figure 17A:
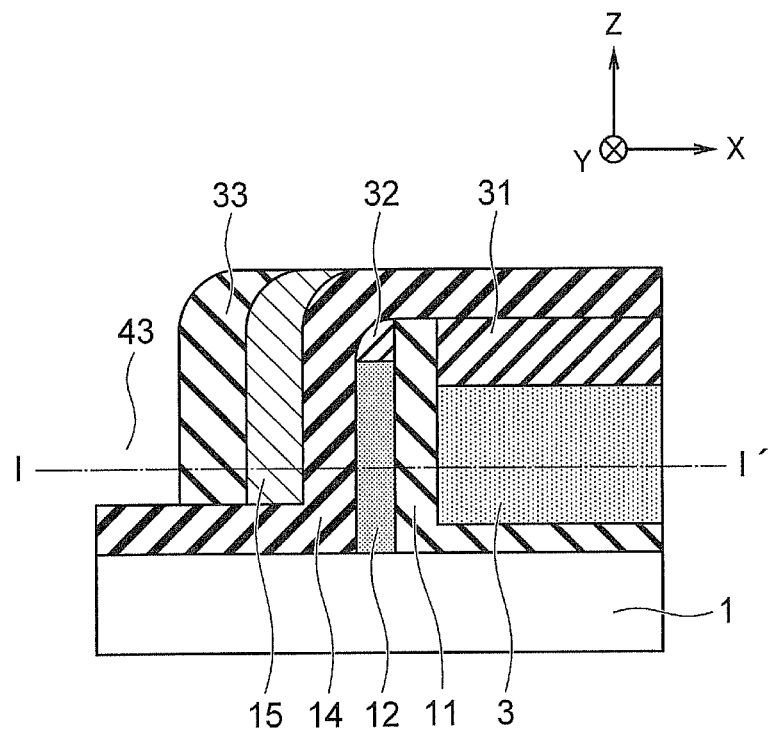
Figure 17B:
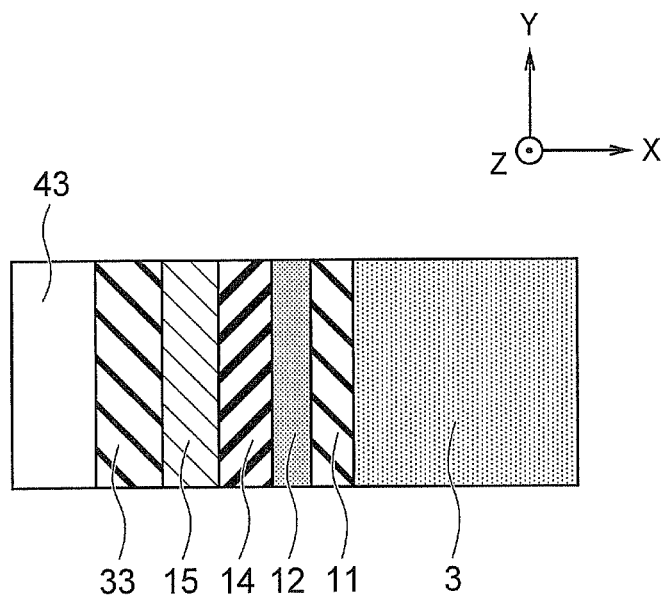

Next, as illustrated in FIGS. 17A and 17B, the gate electrode 15 and the insulator 33 are sequentially formed on the side surface of the impurity semiconductor layer 12 via the gate insulator 14. For example, the gate electrode 15 and the insulator 33 are formed as follows. First, an electrode material for forming the gate electrode 15 is deposited on the entire surface of the substrate 1 and then the electrode material is etched. Next, the insulator 33 is deposited on the entire surface of the substrate 1 and then the insulator 33 is etched. Consequently, the gate electrode 15 and the insulator 33 illustrated in FIGS. 17A and 17B are formed.

Figure 18A:
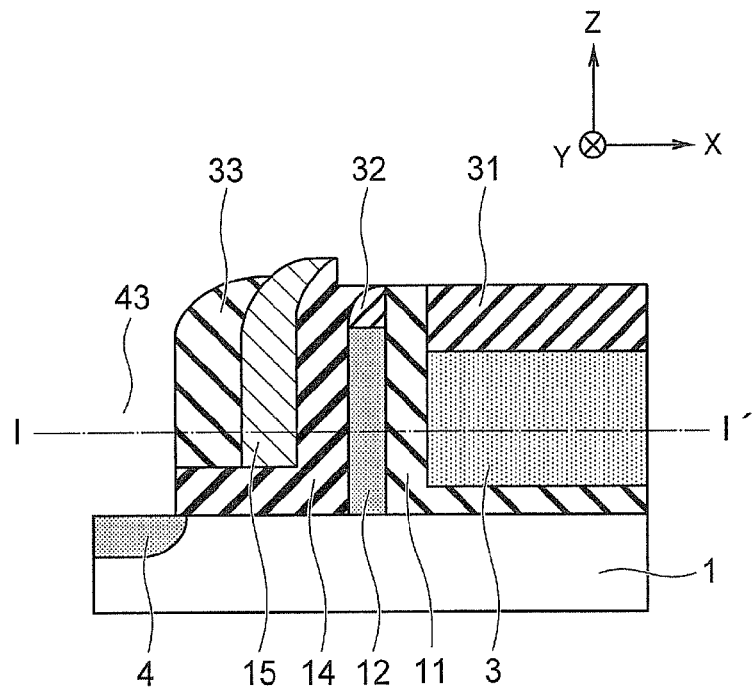
Figure 18B:
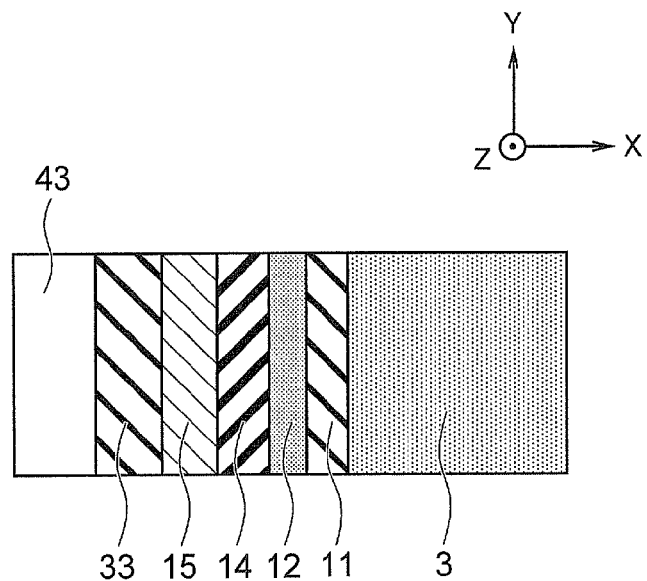

Next, a portion of the gate insulator 14 that is formed on a region of the substrate 1 in which the drain layer 4 is to be formed is removed (FIGS. 18A and 18B). Ions are then implanted into the region of the substrate 1 in which the drain layer 4 is to be formed. In this ion implantation, phosphorus (P) is implanted, for example. The substrate 1 is then annealed, whereby the drain layer 4 is formed on the surface of the substrate 1 (FIGS. 18A and 18B).

Figure 19A:
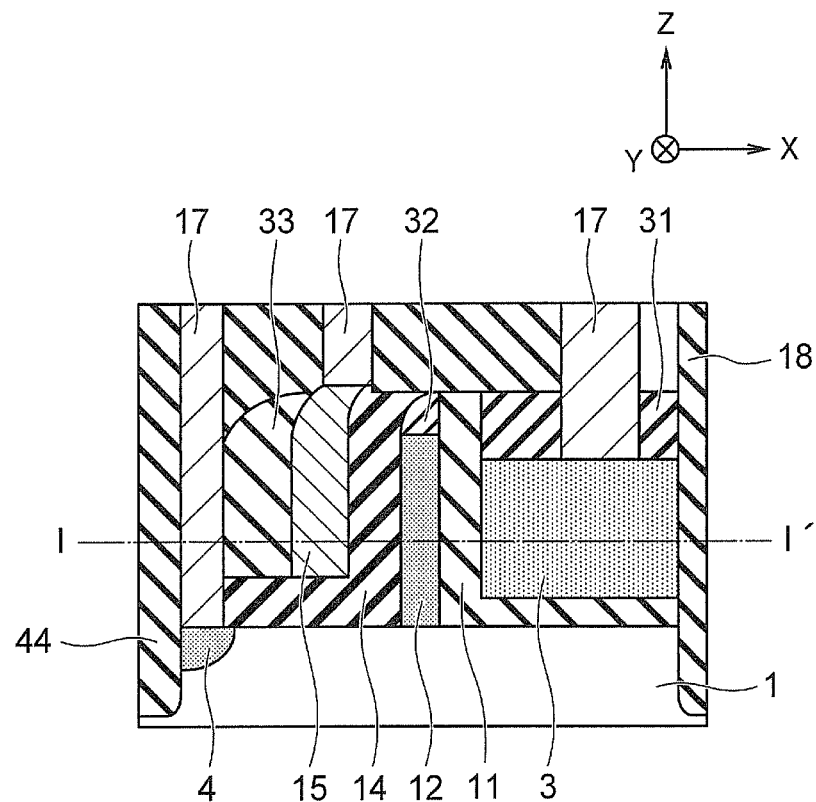
Figure 19B:
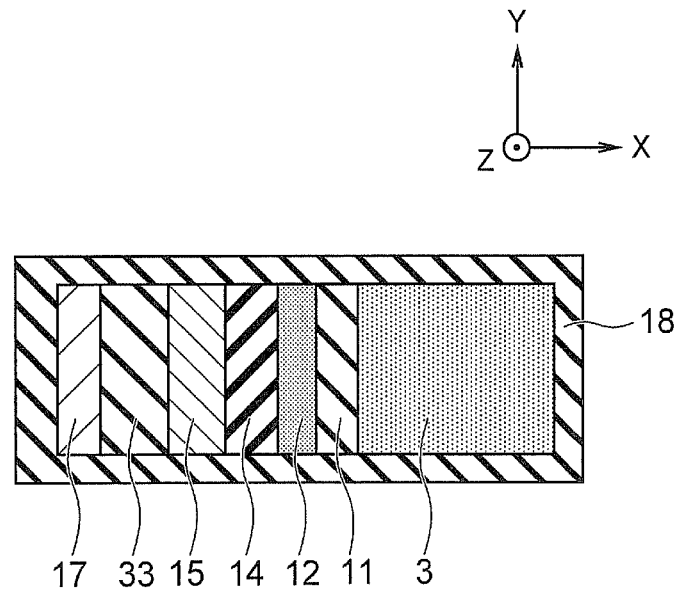

Next, an isolation trench 44 is formed on the surface of the substrate 1 (FIGS. 19A and 19B). The inter layer dielectric 18 is then deposited on the entire surface of the substrate 1 (FIGS. 19A and 19B). The contact plugs 17 are then formed on the source layer 3, the drain layer 4 and the gate electrode 15 in the inter layer dielectric 18 (FIGS. 19A and 19B).

In the present embodiment, various inter layer dielectrics, via plugs, interconnect layers and the like are then formed on the substrate 1. Consequently, the semiconductor device in FIGS. 8A and 8B is manufactured.

(2) Effects of Fourth Embodiment

Effects of the fourth embodiment will be described.

As described above, the tunnel insulator 11 in the present embodiment is formed between the source layer 3 of the first conductivity type and the impurity semiconductor layer 12 of the second conductivity type. Therefore, according to the present embodiment, impurity diffusion between the source layer 3 and the impurity semiconductor layer 12 can be suppressed to maintain the abruptness of the change in impurity concentration, which can provide a large on-state current of the tunnel FET, as similar to the first to third embodiments.

Furthermore, the tunnel insulator 11, the impurity semiconductor layer 12, the gate insulator 14 and the gate electrode 15 in the present embodiment are sequentially formed on a side surface of the source layer 3. Therefore, according to the present embodiment, the on-state current of the tunnel FET can be increased by increasing the sizes of the source layer 3, the tunnel insulator 11, the impurity semiconductor layer 12, the gate insulator 14 and the gate electrode 15 in the vertical direction without increasing the area occupied by the tunnel FET on the substrate 1.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a substrate;
   a source region of a first conductivity type disposed on a surface of the substrate;
   a tunnel insulator disposed on the source region;
   an impurity semiconductor layer of a second conductivity type disposed on the tunnel insulator so as to be separated from the source region via the tunnel insulator, the second conductivity type being different from the first conductivity type;
   a gate insulator disposed on the impurity semiconductor layer;
   a gate electrode disposed on the gate insulator; and
   a drain region of the second conductivity type disposed on the substrate so as to be separated from and electrically connected to the impurity semiconductor layer via a semiconductor layer, or disposed on the substrate as a portion of the impurity semiconductor layer.

2. The device of claim 1, wherein a height of a lower surface of the drain region is higher than a height of an upper surface of the source region.

3. The device of claim 1, further comprising an epitaxial semiconductor layer disposed on the substrate so as to be adjacent to the impurity semiconductor layer,
   wherein the drain region is disposed in the epitaxial semiconductor layer.

4. The device of claim 1, wherein the tunnel insulator is interposed between the source region and the drain region.

5. The device of claim 4, wherein
   the source region and the tunnel insulator extend to a region under the drain region, and
   the drain region is disposed above the source region via the tunnel insulator.

6. The device of claim 1, wherein
   the drain region is separated from the impurity semiconductor layer, and
   a height of a lower surface of the drain region is higher than a height of an upper surface of the impurity semiconductor layer.

7. The device of claim 1, wherein the impurity semiconductor layer comprises a conduction band lower than a conduction band of silicon.

8. The device of claim 1, wherein the impurity semiconductor layer comprises a valence band higher than a valence band of silicon.

9. The device of claim 1, wherein the tunnel insulator comprises a bandgap wider than bandgaps of the source region and the impurity semiconductor layer.

10. The device of claim 1, wherein a thickness of the tunnel insulator is 2 nm or smaller.

11. The device of claim 1, wherein the tunnel insulator contains nitrogen.

12. A semiconductor device comprising:
    a substrate;
    a source layer of a first conductivity type disposed on the substrate;
    a tunnel insulator, an impurity semiconductor layer of a second conductivity type, a gate insulator, and a gate electrode which are sequentially disposed on a side surface of the source layer, the second conductivity type being different from the first conductivity type, and the impurity semiconductor layer being separated from the source layer via the tunnel insulator; and
    a drain layer of the second conductivity type disposed on a surface of the substrate so as to be separated from and electrically connected to the impurity semiconductor layer via a semiconductor layer.

13. The device of claim 12, wherein
    the source layer is disposed on the substrate via the tunnel insulator, and
    the gate electrode is disposed on the substrate via the gate insulator.

14. The device of claim 12, wherein the substrate comprises a protruding portion which protrudes from the substrate, and the impurity semiconductor layer is disposed in the protruding portion.

15. The device of claim 12, wherein the drain layer is disposed on the surface of the substrate so as to be separated from the impurity semiconductor layer.

16. The device of claim 12, wherein the impurity semiconductor layer comprises a conduction band lower than a conduction band of silicon.

17. The device of claim 12, wherein the impurity semiconductor layer comprises a valence band higher than a valence band of silicon.

18. The device of claim 12, wherein the tunnel insulator comprises a bandgap wider than bandgaps of the source layer and the impurity semiconductor layer.

19. The device of claim 12, wherein a thickness of the tunnel insulator is 2 nm or smaller.

20. The device of claim 12, wherein the tunnel insulator contains nitrogen.

* * * * *